(12) United States Patent
Levesque (10) Patent No.: US 9,297,837 B2
(45) Date of Patent: Mar. 29, 2016

(54) OPTICAL SENSOR FOR NON-CONTACT VOLTAGE MEASUREMENT

(71) Applicant: INSTITUT NATIONAL D'OPTIQUE, Québec (CA)

(72) Inventor: Marc Levesque, Saint-Augustin-de-Desmaures (CA)

(73) Assignee: INSTITUT NATIONAL D'OPTIQUE, Quebec (CA)

( * ) Notice: Subject to any disclaimer, the term of this patent is extended or adjusted under 35 U.S.C. 154(b) by 441 days.

(21) Appl. No.: 13/875,517

(22) Filed: May 2, 2013

(65) Prior Publication Data

US 2013/0293218 A1    Nov. 7, 2013

Related U.S. Application Data

(60) Provisional application No. 61/642,056, filed on May 3, 2012.

(51) Int. Cl.
*G01R 31/00* (2006.01)
*G01R 15/22* (2006.01)
*G01R 15/16* (2006.01)

(52) U.S. Cl.
CPC ............... *G01R 15/22* (2013.01); *G01R 15/16* (2013.01)

(58) Field of Classification Search
CPC .. G01R 15/246; G01R 15/242; G01R 15/241; G01R 15/247; G01R 31/311; G01R 31/305; G01R 31/309; G01R 31/002; G01R 31/026; G01R 31/2648; G01R 31/312; G01R 27/26; G01N 27/9046; G01N 27/9093
USPC ........... 324/96, 126, 501, 76.36, 753, 754.27; 250/225, 227.17
See application file for complete search history.

(56) References Cited

U.S. PATENT DOCUMENTS 3,524,133 A * 8/1970 Arndt ................... G01R 31/021
                                                         324/102
4,032,843 A    6/1977 Loucks
(Continued)

FOREIGN PATENT DOCUMENTS

WO          99/42844      8/1999
WO       2006/021030      3/2006

OTHER PUBLICATIONS

Lévesque et al., "Optical Sensor for Non-Contact Voltage Measurement", 2012 CIGRÉ Canada Conference, Sep. 24-26, 2012, 8 pages, CIGRÉ, Montreal, Canada.
(Continued)

*Primary Examiner* — Tung X Nguyen
*Assistant Examiner* — Thang Le
(74) *Attorney, Agent, or Firm* — Fasken Martineau Dumoulin LLP (57) ABSTRACT

A voltage sensor for obtaining a light signal representative of an AC voltage in a live electrical wire having a surrounding electrical field, comprising: a conducting device adapted to be placed in the surrounding electrical field and in galvanic isolation to the live electrical wire for causing a movement of charges and extracting a current from the movement of charges; a micro-light source for emitting a light signal, the micro-light source being operatively connected to the conducting device for receiving the extracted current and being directly powered by the extracted current, an intensity of the light signal being related to a value of the AC voltage in the electrical wire; a light guide, operatively coupled to the micro-light source, for receiving and propagating the light signal over a distance.

10 Claims, 5 Drawing Sheets

(56) References Cited

U.S. PATENT DOCUMENTS

| | | | | |
|---|---|---|---|---|
| 4,052,665 | A | * 10/1977 | Gruenwald | F02P 17/12 |
| | | | | 324/126 |
| 4,054,834 | A | 10/1977 | Boirat et al. | |
| 4,070,572 | A | 1/1978 | Summerhayes | |
| 4,831,327 | A | 5/1989 | Chenier et al. | |
| 4,928,067 | A | 5/1990 | Lind | |
| 5,015,944 | A | * 5/1991 | Bubash | G01R 19/15 |
| | | | | 324/127 |
| 5,059,910 | A | * 10/1991 | Ochi | G01R 15/24 |
| | | | | 324/537 |
| 5,208,541 | A | * 5/1993 | Yerkovich | F02P 17/12 |
| | | | | 324/393 |
| 5,751,143 | A | * 5/1998 | Fava | G01R 15/22 |
| | | | | 324/126 |
| 6,118,270 | A | * 9/2000 | Singer | G01R 15/181 |
| | | | | 324/115 |
| 6,124,706 | A | * 9/2000 | Woods | G01R 1/071 |
| | | | | 324/96 |
| 7,102,478 | B2 | * 9/2006 | Pridmore, Jr. | H04B 3/56 |
| | | | | 336/175 |

OTHER PUBLICATIONS

Bleys, "Floating input, optically isolated, high-voltage measurement probe" Rev. Sci. Instrum. May 1976, pp. 621-623, vol. 47, No. 5, American Institute of Physics, United States.

* cited by examiner

000# OPTICAL SENSOR FOR NON-CONTACT VOLTAGE MEASUREMENT

TECHNICAL FIELD

The invention relates to voltage sensors and more particularly to non-intrusive voltage sensors using a micro-light source.

BACKGROUND OF THE ART

Over the past few years, power systems (generation, transmission, and distribution) have undergone several major technological developments with optimized control as their ultimate aim. These developments rely on a better understanding of power system dynamics and inevitably require more instrumentation. In this context, it is important to minimize the electrical, mechanical and environmental impacts of new instrumentation, which must also meet particular reliability and precision requirements as well as isolation standards for each voltage level.

Generally speaking, current and voltage are the two primary inputs for all electrical parameter measurements. Measuring current is normally quite straightforward and meets the conditions mentioned above. Several sensors are available that do not even require an open circuit. In addition to a wide measurement range, excellent precision and a high degree of electrical isolation, these sensors are also robust and can be installed on a power system with no major service continuity impacts.

However, the same cannot be said of voltage measurement, which generally requires the use of measurement transformers connected in parallel with the line(s) forming the system. From a mechanical point of view, these voltage transformers are relatively heavy and their installation requires certain precautions. In addition, installing them on medium or high-voltage systems sometimes requires the use of a bypass disconnect switch so they can be isolated in case of malfunction.

A few years ago, measuring equipment suppliers started to develop voltage sensors that offer good precision with no galvanic contact. However, some of these sensors are quite large, and others require an external supply source.

SUMMARY

A system for measuring the voltage of an electric line without galvanic contact with its conductor is disclosed. The device consists of a micro-light source supplied via a movement of charges caused by a conductive device in the electrical field of the electric line and an optical fiber to transmit the light signal. A read-out module is situated at a distance to receive, process and communicate information on the amplitude and phase of the voltage being measured.

The optical fiber provides a high degree of electromagnetic interference immunity and excellent electrical isolation and breakdown resistance. The device is inherently safe for the power system, because failure of the device does not cause a short circuit to ground.

In accordance with a first aspect, there is provided a voltage sensor for obtaining a light signal representative of an AC voltage in a live electrical wire having a surrounding electrical field. The voltage sensor comprises a conducting device adapted to be placed in the surrounding electrical field and in galvanic isolation to the live electrical wire for causing a movement of charges and extracting a current from the movement of charges; a micro-light source for emitting a light signal, the micro-light source being operatively connected to the conducting device for receiving the extracted current and being directly powered by the extracted current, an intensity of the light signal being related to a value of the AC voltage in the electrical wire; a light guide, operatively coupled to the micro-light source, for receiving and propagating the light signal over a distance.

In one embodiment, the conducting device is a conductive plate and the conductive plate is operatively connected to an earth ground through the micro-light source.

In one embodiment, the conducting device is two conductive plates and the conductive plates are in electrical connection through the micro-light source.

In one embodiment, the conducting device is a conductive cylinder around an elongated section of the live electrical wire and the conductive cylinder is operatively connected to an earth ground.

In one embodiment, a layer of dielectric material is provided between the conductive cylinder and the electrical wire.

In one embodiment, the conducting device is two concentric conductive cylinders around an elongated section of the live electrical wire and the concentric conductive cylinders are in electrical connection through the micro-light source.

In one embodiment, the concentric conductive cylinders include an interior cylinder and an exterior cylinder and the exterior cylinder is operatively connected to an earth ground.

In one embodiment, the micro-light source is a micro-light emitting diode (LED) source.

In one embodiment, the voltage sensor further comprises a return-path component being operatively connected to the conducting device and the micro-LED source.

In one embodiment, the light guide is a plastic optical fiber.

In one embodiment, the live electrical wire is unsheathed and a layer of insulating material is provided between the conducting device and the live electrical wire.

In one embodiment, the voltage sensor further comprises a read-out unit, operatively connected to the light guide, including a detector for receiving the propagated light signal and a processor for determining an intensity value for the light signal and determining a measurement of the AC voltage in the live electrical wire using the intensity value.

In one embodiment, a phase of the light signal is in phase with the AC voltage of the electrical wire and the processor of the read-out unit further determines a light signal phase of the light signal and a voltage phase of the voltage in the electrical wire using the light signal phase.

In accordance with a second aspect, there is provided a method for obtaining a light signal representative of an AC voltage in a live electrical wire having a surrounding electrical field, comprising: placing a conducting device in the surrounding electrical field and in galvanic isolation to the live electrical wire for causing a movement of charges; extracting a current from the movement of charges to power a micro-light source; emitting a light signal from the micro-light source, an intensity of the light signal being related to a value of the AC voltage in the electrical wire; receiving and propagating the light signal over a distance via a light guide operatively coupled to the micro-light source.

In one embodiment, the method further comprises receiving the propagated light signal using a detector; determining an intensity value for the light signal using a processor; determining a measurement of the AC voltage in the live electrical wire using the intensity value using the processor.

BRIEF DESCRIPTION OF THE DRAWINGS

Having thus generally described the nature of the invention, reference will now be made to the accompanying drawings, showing by way of illustration an example embodiment thereof and in which

FIG. 3 includes FIG. 3A and FIG. 3B and shows a Faraday cage example embodiment with two concentric conductive cylinders in open (FIG. 3A) and closed (FIG. 3B) clamping configurations;

It will be noted that throughout the appended drawings, like features are identified by like reference numerals.

DETAILED DESCRIPTION

A system for measuring the voltage of an electric line without galvanic contact with its conductor is disclosed. The device includes a micro-light source supplied via a movement of charges caused by a conductive device in the electrical field of the electric line and an optical fiber to transmit the light signal directly representative of the electrical field near the electric line. A read-out module is situated at a distance to receive, process and communicate information on the amplitude and phase of the voltage being measured.

The optical sensor for non-contact voltage measurement could be used for residential installations which use voltages as low as 100 V. It could also be used for power line measurements for voltages as high as hundreds of kV.

The non-intrusive voltage sensor casing could be designed and manufactured to clamp on and off an electrical wire and would not require permanent installation or perforation of the insulating sheath of the electrical wire. It could alternatively be shaped to receive a disconnected electrical wire within an elongated aperture of the casing prior to connection of the electrical wire for live operation. As will be readily understood, should one wish to permanently install the non-intrusive voltage sensor on an electrical wire, it would also be possible to do so.

The sensor carries out a somewhat instantaneous measurement of the voltage in the conductor without galvanic contact with the wire and without disrupting the electrical connections of the conductor.

A movement of charges caused by a conductive device in the electrical field of the electric line generates an alternating current, without galvanic contact with the conductor. However, even with a strong movement of charges, the current generated can be quite weak (a few µA). With prior art systems, in order to measure such a weak current in proximity to power lines, relatively effective electromagnetic insulation would have to be installed all along the current's path or amplification would be required at the sensor level to transmit an electrical or optical signal which would be sufficiently strong.

To significantly reduce the need for electromagnetic insulation, a micro-light source is placed directly at the measurement point, thus converting the weak electrical signal to a weak light signal. A conducting device along with a micro-light source constitutes the sensor. An optical fiber is used to transmit the light signal. A read-out module situated at a distance is used to receive, process and communicate information on the amplitude and phase of the voltage being measured.

Only the sensor requires a substantial amount of electromagnetic insulation, because once the electrical signal is converted into a light signal, it is no longer susceptible to electromagnetic interference. The read-out module may be located a few dozen meters away, in an area where it is practical to convert the light signal into any other type of signal that can be transmitted over a longer distance. Optical, electrical or radio signals can be used, for example, and they can be analog or digital.

The device can also be used to measure the phase of the voltage, as long as the micro-light source has a fast enough response time to temporally resolve the signal with a few harmonics, a condition easily met with a Light Emitting Diode (LED).

The sensor is electrically isolated from the read-out module. The two are linked with a glass or polymer optical fiber, which could also be sheathed with highly effective insulating material. The material used can have a breakdown voltage greater than that of air. This high degree of electrical isolation and breakdown resistance could be an even greater advantage at medium or even high voltages.

The non-intrusive voltage sensor is adapted to detect the electrical field which surrounds the insulating sheath and/or wire and is usually not affected, or only slightly affected, by the current passing through the conductor and therefore by the magnetic field surrounding the conductor. Should some residual sensitivity be observed with larger loads, it would be possible to compensate for this by identifying the current flow.

Figure 1:
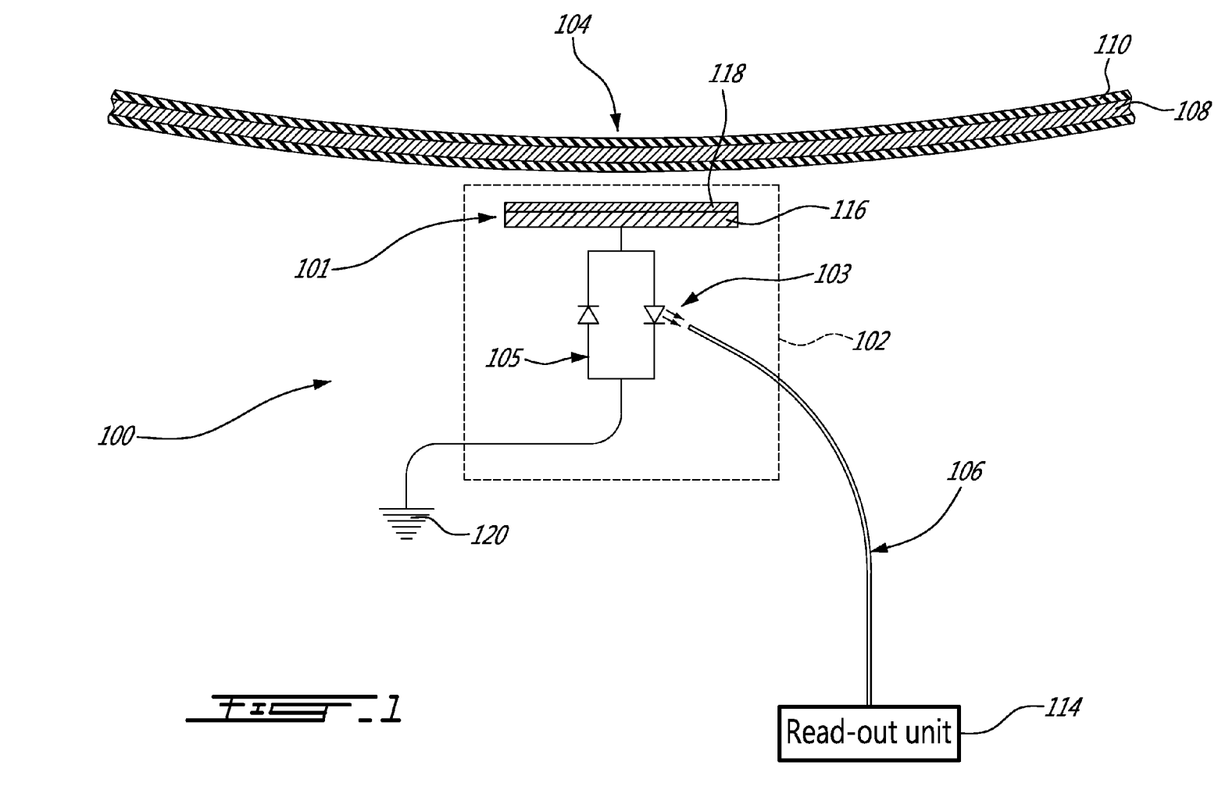
FIG. 1 shows the main components of an example voltage sensor using a conductive plate for the conducting device.

FIG. 1 schematically illustrates the operating principle. A non-intrusive voltage sensor system 100 is shown.

The non-intrusive voltage sensor system 100 comprises a conducting device 101, a micro-light source 103, such as a micro-LED source, an optional return-path circuit 105 and an optical fiber 106. The conducting device 101, the micro-light source 103 and the optional return path circuit 105 can be housed in a sensor body 102. In use, the sensor body 102 is placed in close proximity to an electrical conductor 104 such that the conducting device 101 enters the electrical field surrounding the electrical conductor 104. The electrical conductor 104 includes an electrical wire 108 which may optionally have an insulating sheath 110.

The optical fiber 106 captures the light signal emitted from the micro-LED source 103 and allows the light signal to travel to a read-out unit 114.

The conducting device 101 together with the electrical wire 108, senses the electrical field which surrounds the electrical wire 108. The electrical wire 108 can be a 120 V AC voltage conductor for example. In use, the conductive surface 116 is placed in close proximity to the electrical wire 108 and is therefore located close to an edge of the sensor body 102.

The micro-light source 103, for example a LED micro-light source, is powered by a small current obtained from a movement of charges caused by a conductive device, the conductive surface 116, in the electrical field of the electrical conductor 104. The small current is converted to a light signal by the micro-light source 103. The light signal of the micro-light source is then propagated from the micro-light source 103 within an optical fiber 106 to a read-out sub-system 114. The optical fiber 106 can be a plastic optical fiber (POF), for example.

In applications where the electrical wire 108 is not covered by an insulating sheath 110, the sensor body 102 can include an insulation layer 118 to ensure that there is no galvanic contact between the electrical wire 108 and the conductive surface 116.

To avoid damaging the micro-light source in case of malfunction of the sheath of the electrical wire or stray currents, it is possible to add additional capacitors in series with the sensing sub-system.

As will be readily understood, the non-intrusive voltage sensor 100 could also be used to determine whether there is voltage in a power cable consisting in an assembly of two or more electrical conductors usually held together with an overall sheath. The non-intrusive voltage sensor would then obtain a presence/absence reading for the voltage of the power cable.

Sensor Body

The sensor body 102 can be manufactured to closely mate with the electrical conductor 104 thereby ensuring an appropriate positioning of the components of the non-intrusive voltage sensor 100 within the sensor body 102 with respect to the electrical conductor 104. It could be adapted to loosely mirror and receive the shape of the electrical conductor 104. As will be readily understood, the sensor body 102 need not closely mate with the electrical conductor 104. Alternatively, it could have a shape which does not mate with the electrical conductor 104.

The voltage sensor 100 can be fully contactless or can contact the optional sheath 110 of the electrical conductor 104 or the electrical wire 108 itself. As will be readily understood, the voltage sensor 100 does not need to contact the electrical wire 108 to obtain a voltage reading and therefore, there is no need to perforate the sheath to create an intrusive and permanent installation for the sensor body 102 on the electrical conductor 104. Indeed the sensor should not have galvanic contact with the electrical conductor 104.

Micro-Light Source

The micro-light source is able to efficiently convert weak electrical currents into light signals. The micro-light source should be able to pick up µA-range currents. It will produce a light signal with an intensity substantially proportional to the magnitude of the weak electrical current.

Tests were carried out with a µLED source from supplier InfiniLED™. Its current threshold was about 8 µA which was slightly too high for a low-voltage measuring device. As will be readily understood, a micro-LED with a current threshold of about 0.5 µA would yield better results for a low-voltage application. A person skilled in the art will select a µLED with an appropriate current threshold and an appropriate pattern of diode conduction.

In order for the movement of charges of a few picoFarads (pF) to generate a sufficient current to power the micro-light source, a micro-light source which only requires 0.5 µA to generate an emitted power density of more than 200 mW.mm$^{-2}$ (100 nW) would yield acceptable results, for example.

It could also be possible to use a dual-LED kit in which each LED has a different polarity, thereby emitting an optical signal during both the positive and negative phases of the voltage in the electrical wire.

Return-Path Circuit

The return-path circuit is optional. In the case where the micro-light source is a micro-LED source, the return-current path 105 can be provided in the circuit to allow the current to travel and to protect the micro-LED source from accidental peak currents. The return-current path 105 can include at least one component which can be, for example, a resistor, a diode, or a return-path light source, such as a LED source.

If the return-path circuit includes a return-path light source, it can be coupled to a second optical fiber or to the same fiber. This would allow obtaining an optical signal during the negative phase of the voltage in the electrical wire.

Ground Reference

The ground reference 120 is optional.

If the conducting device is a conductive plate 116 brought in close proximity to the electrical wire 108, the ground reference may be required. The ground reference 120 can be obtained from the support wire on which the electrical conductors are often provided. If this ground reference 120 is not available near the conducting element, the ground reference can be obtained elsewhere. A conductive coating could be provided on the optical fiber. The thin conductive coating would then be connected to a ground reference. A small conducting wire could be added to the cable of the optical fiber and also be connected to the ground reference. This small conducting wire would not create a short circuit since it would have a low current carrying capacity. One should however avoid creating stray currents. Design of the casing of the voltage sensor may help in limiting stray currents.

Figure 2:
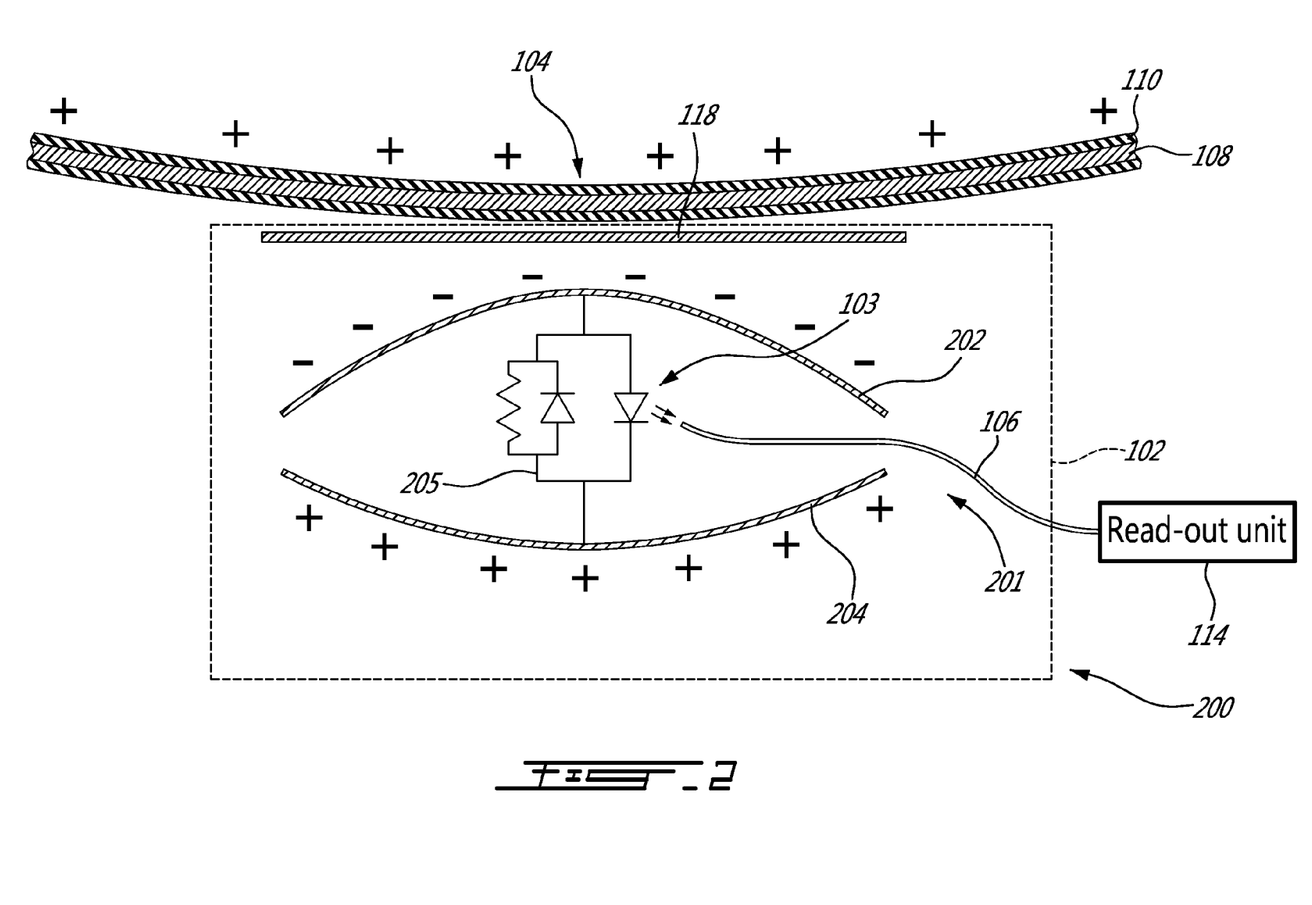
FIG. 2 shows the main components of an example voltage sensor using two conductive plates for the conducting device.

If the conducting device is a Faraday cage, the ground reference may be omitted. The Faraday cage principle indicates that an external static electrical field will cause the electrical charges within the cage's conducting material to redistribute themselves so as to cancel the field's effects in the cage's interior. In order to create a Faraday cage sensor embodiment 200, the sensor body 102 will include at least two conductive shields 202, 204 which will surround the micro-light source 103 and its related components 205 as shown in FIG. 2. The conductive shields 202, 204 of the sensor body will become charged as the sensor is placed in close proximity with the electrical wire 108. The electrical wire 108 can be partly or fully surrounded by the conductive shields 202, 204. The nearest conductive shield 202 will take on a negative charge and the furthest conductive shield 204 will take on a positive charge. The electrical field within the sensor body 102 would then be nil.

This would yield very low currents for the sensing sub-system. With an AC high voltage of the order of a few hundreds of kV, currents of 10 or 100 µA can be generated which would allow use of a micro-light source to generate an optical signal of a few µW. This approach measures changes in the electrical field of the electrical wire and does not measure changes in the actual voltage of the electrical wire. Other components do form part of the electrical field. However, for predetermined distances and fixed phases of the elements at different voltages, it would be possible to calibrate the measured electrical field to obtain a voltage reading for the electrical wire.

EXAMPLE EMBODIMENTS

In the example embodiments, the live electrical wire has an AC voltage causing the charge at the electrical wire to alternate between a −Q and +Q charge.

First Example Embodiment

Figure 3A:
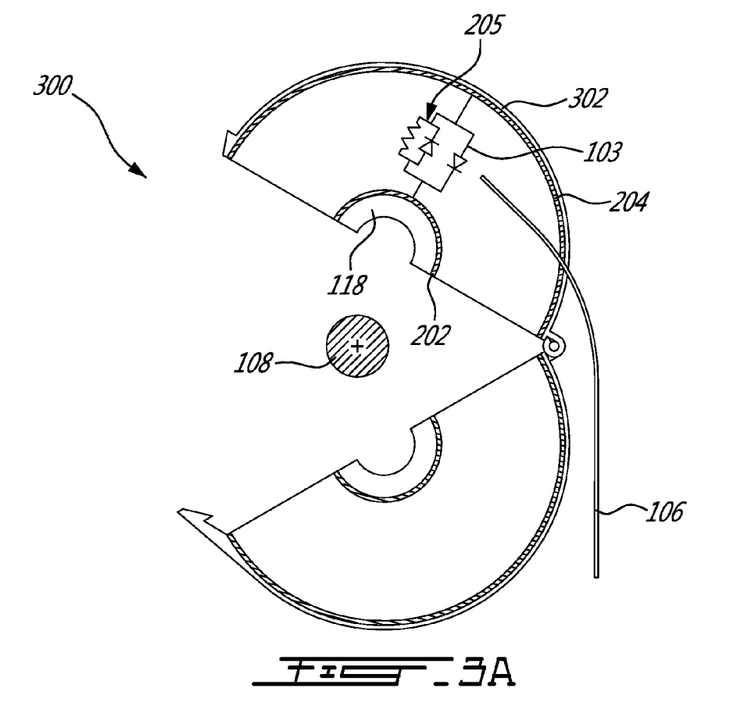
Figure 3B:
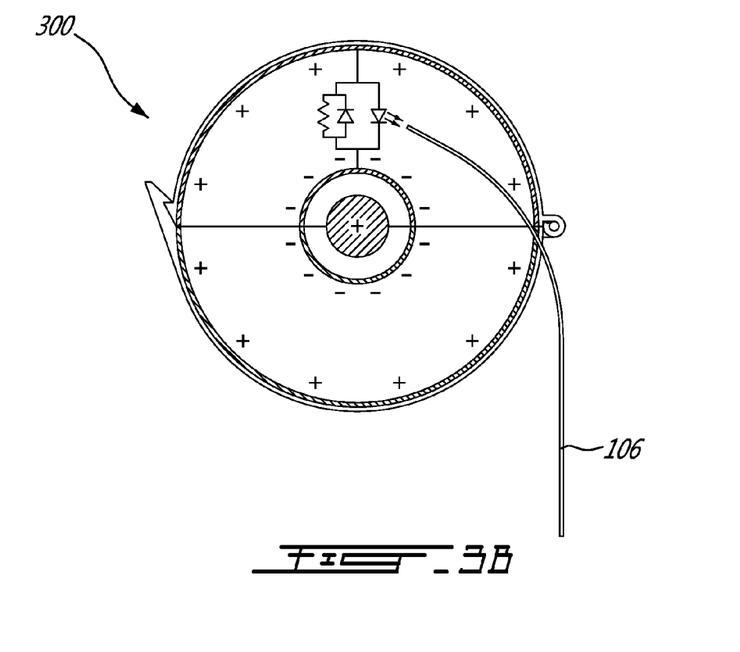

In a first Faraday cage example embodiment 300 shown in FIG. 3A and FIG. 3B, an interior hollow conductive cylinder 202 surrounds an elongated section of the live electrical wire 108. An exterior hollow conductive cylinder 204 surrounds the interior conductive cylinder 202. The cylinders 202, 204 are held in relative configuration with each other and with the electrical wire using insulating caps at both ends (not shown). Since the cylinders 202, 204 are longer than their diameters, the impact of the insulating caps is negligible. The cylinders 202, 204 are operatively connected by the sensing sub-system including the micro-light source 103 and the return path components 205. In one example embodiment, the cylinders 202, 204 can have a length of 20 to 50 cm. If the electrical wire in unsheathed, the sensor includes an interior insulating layer 118. An intermediate insulating layer is also provided between the cylinders. The interior insulating layer 118 and the intermediate insulating layer can be filled with air or with a dielectric material such as polymers or ceramics. The cylinders 202, 204 can be made of any conductive material, such as aluminum, for example.

Considering that exterior electrical fields are negligible and that the conducting device has a null charge at the beginning, when the live electrical wire 108 has a +Q charge, the interior cylinder 202 has a −Q charge to cancel out the field. The exterior cylinder 204 has a charge of +Q. When the AC voltage forces the charge at the electrical wire to change from +Q to −Q, a charge of a magnitude 2Q will travel in the sensing sub-system.

This first example embodiment 300 gives a direct measurement of the charge Q. It varies with the electrical field. It does not provide a measurement of the voltage in the electrical wire. However, knowing the electrical conditions of the installation of the wire and sensor or via calibration, the voltage in the electrical wire can be extrapolated from the charge Q.

The housing of the sensor 302 has a clamp type configuration to allow clamping of the sensor on the electrical wire 108. In FIG. 3A, the housing is open for installation or removal of the sensor. In FIG. 3B, the housing is closed for live measurement of the AC voltage in the electrical wire.

The sensing sub-system and the optical fiber 106 are shown schematically at a longitudinal end of the cylinders. As will be readily understood, the packaging and configuration of these components will be optimized by one skilled in the art.

Second Example Embodiment

Figure 4:
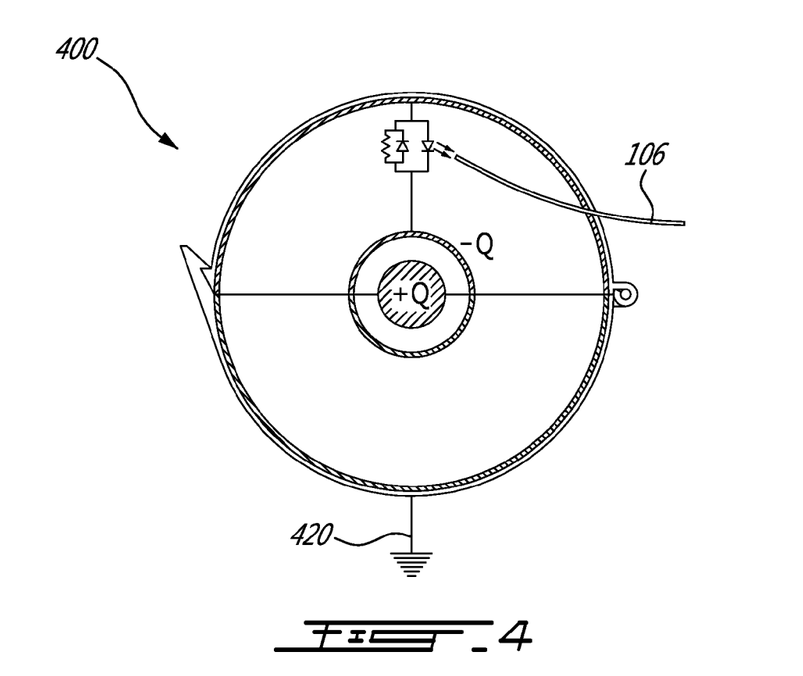
FIG. 4 shows a Faraday cage example embodiment with two concentric conductive cylinders, the exterior cylinder being grounded.

In this second example embodiment 400 shown in FIG. 4, the configuration is similar to that of the first example embodiment 300. However, the exterior hollow conductive cylinder 204 is grounded. The ground link 420 only needs to support a charge of 2Q within a half-cycle.

Considering that exterior electrical fields are negligible, when the live electrical wire has a +Q charge, the interior cylinder has a −Q charge to cancel out the field. The exterior cylinder has an approximately null charge because it is grounded and therefore maintained to 0V. In reality, it will have a charge just sufficient to cancel out the electrical contributions of the environment. When the AC voltage forces the charge to change from +Q to −Q, a charge of a magnitude 2Q will travel in the electrical conductor and in the ground link.

This second example embodiment 400 gives a direct measurement of the charge Q. However, knowing that the cylinders are maintained at 0V, and knowing the interior radius of the interior cylinder, the potential at the electrical wire can be determined.

Third Example Embodiment

Figure 5:
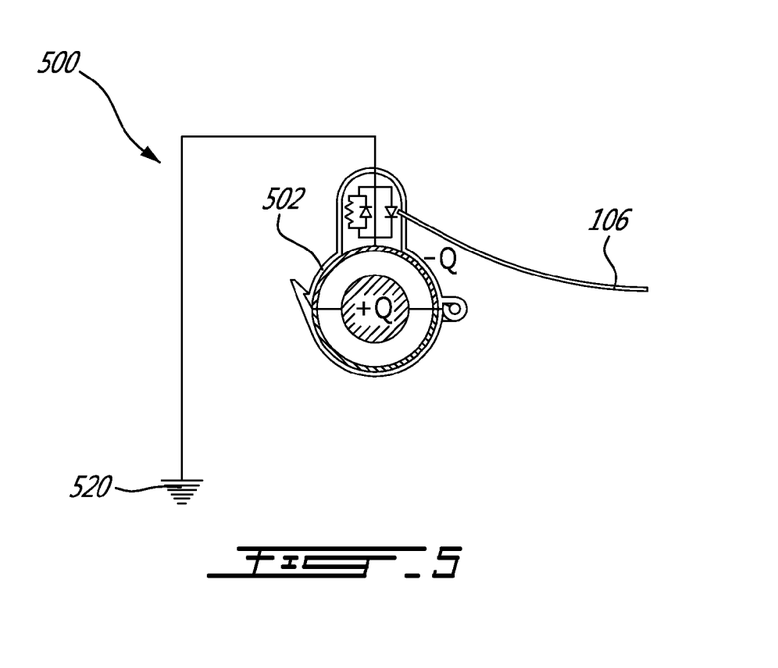
FIG. 5 shows a conducting element example embodiment with a single grounded conductive cylinder.

In this third example embodiment 500 shown in FIG. 5, the exterior hollow conductive cylinder is omitted. The remaining cylinder 202, a hollow conductive cylinder is grounded via ground link 520.

When the AC voltage forces the charge to change from +Q to −Q in the electrical wire, a charge of a magnitude 2Q will travel in the electrical conductor and in the ground link. Indeed, even if the exterior cylinder is omitted, the ground link ensures that the charge of 2Q travels in the electrical conductor. This third example embodiment 500 also gives a direct measurement of the charge Q.

Fourth Example Embodiment

Figure 6:
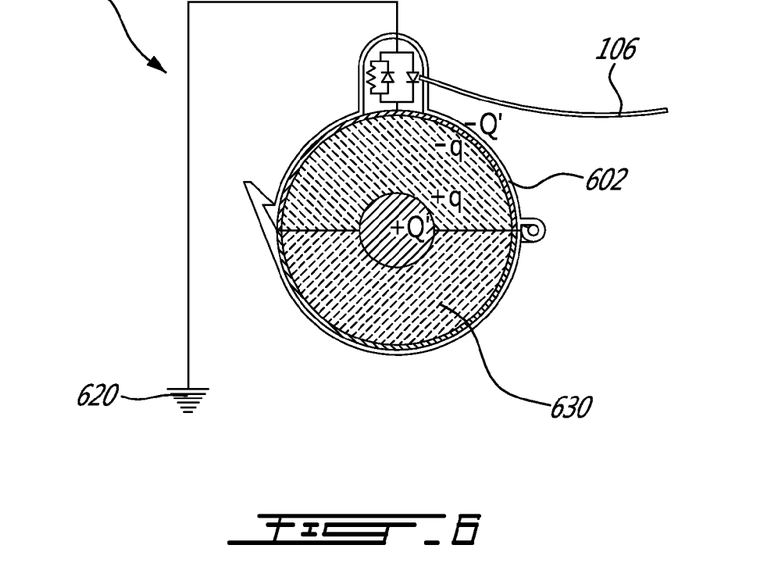
FIG. 6 shows a conducting element example embodiment with a single grounded conductive cylinder, in which a dielectric material is present between the conductive cylinder and the electrical wire.

In this fourth example embodiment 600 shown in FIG. 6, a layer of dielectric material 630 is present between the electrical wire and the remaining cylinder. The remaining cylinder is still grounded via ground link 620.

The dielectric material gets polarized and a −q charge becomes present near the electrical wire while a −q charge becomes present near the remaining cylinder. If the electrical wire still has a charge of +Q, we know that $+Q=+Q'-q$ and $-Q=-Q'+q$. The Q' charge measured when a dielectric layer is present will therefore be greater than Q measured when there is no dielectric layer. Indeed, $Q'/Q=\in_r$, where $\in_r$ is the relative permittivity of the dielectric material. The charge travelling in the electrical conductor will be 2Q'.

Fifth Example Embodiment

Figure 7:
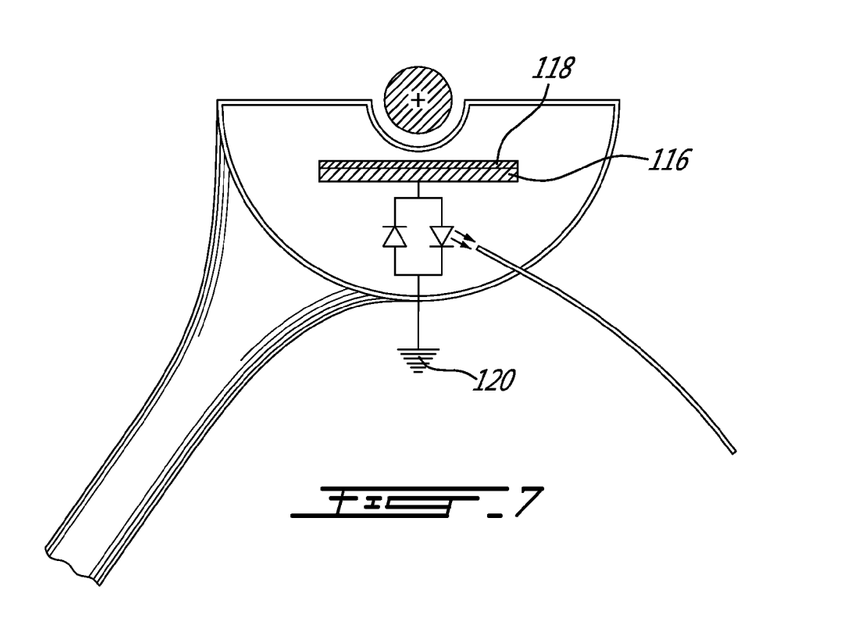
FIG. 7 shows a conductive plate example embodiment in which the sensor housing is shaped to allow the conductive plate to be positioned in close proximity to the electrical wire.

In this fifth example embodiment 700 shown in FIG. 7, the conducting device is a single conductive plate 116. It is brought in close proximity to the electrical wire 108 without clamping on it. The shape of the casing 702 helps the user to position the conductive plate 116 in appropriate relative configuration to the electrical wire 108.

Light Guide

The sensor 100 sends the optical signal from the micro-light source 103 to a read-out sub-system 114 via an optical fibered link 106. This optical signal has an intensity value related to the voltage present in the electrical conductor 104. The fibered link 106 between the sensor and the read-out sub-system is an optical fiber or any light guide which does not require power and does not need to carry electricity. It simply carries an optical signal from the sensor 100 to the read-out sub system 114. The optical signal is strong enough to ensure readability of the optical signal at a location away from the sensing sub-system, for example at a location meters or tens of meters away from the location of the sensing sub-system, even when using plastic optical fibers. This optical signal is unaffected by electromagnetic perturbations in the environment of the fiber. It can also act as an electrical insulator between the sensing sub-system and the read-out sub-system.

Read-Out Module

The read-out module 114 is adapted to transform the intensity and phase reading of the optical signal into an electrical output signal. This can be done using a detector such as a photodiode. This electrical signal represents the intensity and phase of the light over time. The intensity of the light signal will be related to the value of the voltage in the electrical wire and the light signal will be in phase with the voltage of the electrical wire.

The detector sub-system is in communications with a data analysis sub-system which could include printed circuit boards with data processing capabilities, such as a processor to allow analysis of the electrical signal. For example, instantaneous voltage and phase readings could be extracted, averages could be calculated, time-stamping and event recordal could be performed, historical data could be cumulated, harmonic content analysis could be performed. The data could be further transmitted to other modules, such as anomaly-detection algorithms to allow an in-depth analysis of the grid. As will be readily understood, the electrical signal could be converted to a digital signal.

Calibration

Characterization of micro-LED temperature behavior and development of a signal compensation approach may be required as will be understood by one skilled in the art.

It may be sufficient to simply calibrate the micro-LED at different temperatures. If the behavior of the micro-LED as a function of temperature and time is reproducible, the calibration approach may be appropriate.

A second substantially identical micro-LED may be used to determine the behavior of the micro-LED provided in the sensor. The second micro-LED is not electrically connected to the voltage sensor. It is kept at identical temperature to the voltage sensor micro-LED. A known current is made to flow in the second micro-LED. The output optical power is measured. The electrical-to-optical conversion factor of the second micro-LED will then be known at all times. The second micro-LED being substantially identical to the voltage sensor micro-LED, the electrical-to-optical conversion facture of the micro-LED of the voltage sensor can be extrapolated.

Calibration tests can be carried out to determine the impact of other parameters such as temperature, presence of other electrical fields in the area, electromagnetic noise, magnetic fields, etc., on the reading obtained by the sensor 100. A calibration adjustment can then be done on the measured voltage to increase accuracy of the reading.

The embodiments described above are intended to be exemplary only. The scope of the invention is therefore intended to be limited solely by the appended claims.

I claim:

1. A voltage sensor for obtaining a light signal representative of an AC voltage in a live electrical wire having a surrounding electrical field, comprising:
    a conducting device comprising a first conductive shield placed at a first distance from said live electrical wire and a second conductive shield placed at a second distance from said live electrical wire, said first and second distances being different, said conducting device being in galvanic isolation from said live electrical wire and from any other electrical conductor, said conducting device being adapted to be placed in said surrounding electrical field for causing a movement of charges and extracting a current from said movement of charges;
    a micro-light source for emitting said light signal, said micro-light source being operatively connected to said first and second conductive shields and allowing said extracted current to flow from one of said conductive shields to the other, said micro-light source being directly powered by said extracted current, an intensity of said light signal being related to a value of said AC voltage in said live electrical wire;
    a light guide, operatively coupled to said micro-light source, for receiving and propagating said light signal over a distance.

2. The voltage sensor as claimed in claim 1, wherein said first conductive shield is a hollow interior cylinder and said second conductive shield is a hollow exterior cylinder, said interior and exterior cylinders being disposed concentrically around an elongated section of said live electrical wire.

3. The voltage sensor as claimed in claim 1, wherein said micro-light source is a micro-light emitting diode (LED) source.

4. The voltage sensor as claimed in claim 3, further comprising a return-path circuit operatively connected to said first and second conductive shields.

5. The voltage sensor as claimed in claim 1, wherein said light guide is a plastic optical fiber.

6. The voltage sensor as claimed in claim 2, wherein said live electrical wire is unsheathed and wherein a layer of insulating material is provided between said hollow interior cylinder and said live electrical wire.

7. The voltage sensor as claimed in claim 1, further comprising a read-out unit, operatively connected to said light guide, including a detector for receiving said propagated light signal and a processor for determining an intensity value for said light signal and determining a measurement of said AC voltage in said live electrical wire using said intensity value.

8. The voltage sensor as claimed in claim 7, wherein a phase of said light signal is in phase with said AC voltage of said electrical wire and wherein said processor of said read-out unit further determines a light signal phase of said light signal and a voltage phase of said voltage in said electrical wire using said light signal phase.

9. A method for obtaining a light signal representative of an AC voltage in a live electrical wire having a surrounding electrical field, comprising:
    placing a conducting device in said surrounding electrical field for causing a movement of charges, said conducting device comprising a first conductive shield placed at a first distance from said live electrical wire and a second conductive shield placed at a second distance from said live electrical wire, said first and second distances being different, said conducting device being in galvanic isolation from said live electrical wire and from any other electrical conductor;
    extracting a current from said movement of charges to power a micro-light source;
    emitting said light signal from said micro-light source, an intensity of said light signal being related to a value of said AC voltage in said electrical wire;
    receiving and propagating said light signal over a distance via a light guide operatively coupled to said micro-light source.

10. The method as claimed in claim 9, further comprising:
    receiving said propagated light signal using a detector;
    determining an intensity value for said light signal using a processor;
    determining a measurement of said AC voltage in said live electrical wire using said intensity value using said processor.

* * * * *